United States Patent
Young et al.

(10) Patent No.: US 10,346,708 B2
(45) Date of Patent: Jul. 9, 2019

(54) IMAGE PROCESSING METHOD

(71) Applicant: Synopsys, Inc., Mountain View, CA (US)

(72) Inventors: Philippe Georges Young, Devon (GB); David Raymont, Devon (GB); Sumit Paranjape, Devon (GB)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/594,811

(22) Filed: May 15, 2017

(65) Prior Publication Data

US 2017/0249529 A1    Aug. 31, 2017

Related U.S. Application Data

(63) Continuation of application No. 14/283,934, filed on May 21, 2014, now Pat. No. 9,652,889.

(30) Foreign Application Priority Data

Jun. 25, 2013    (GB) .................................. 1311293.3

(51) Int. Cl.
    *G06T 15/00*    (2011.01)
    *G06K 9/46*     (2006.01)
    (Continued)

(52) U.S. Cl.
    CPC ............. *G06K 9/46* (2013.01); *B33Y 50/00* (2014.12); *G06F 17/50* (2013.01); *G06T 15/04* (2013.01);
    (Continued)

(58) Field of Classification Search
    CPC ........ G06T 17/10; G06F 17/50; B33Y 50/00; B29C 67/0059
    (Continued)

(56) References Cited

U.S. PATENT DOCUMENTS 4,710,876 A    12/1987    Cline et al.
5,048,109 A    9/1991    Bloomberg et al.
(Continued)

FOREIGN PATENT DOCUMENTS

EP    0618545 A2    10/1994
JP    11224258    8/1999
(Continued)

OTHER PUBLICATIONS

Barequet G. Using geometric hashing to repair CAD objects. IEEE Computational Science and Engineering. Oct. 1997;4(4):22-8.*
(Continued)

*Primary Examiner* — Phu K Nguyen
(74) *Attorney, Agent, or Firm* — Haybes Beffel & Wolfeld LLP (57) ABSTRACT

A computer-implemented image processing technique for selectively recovering the features of an original CAD model after the original CAD model has been converted to a digitized image and a new CAD model generated from the digitized image. The original boundary representation provides a template to transform the representation through processing under governance of a programmed processor so as to recover accuracy and reintroduce feature edges and feature corners as well as other detailed features to the CAD model obtained from the digitized image, e.g., to enable detailed features to be retained that would otherwise have been lost due to the lossy conversion into image space. The method operates to better ensure that reconstructed boundary vertices lie on original CAD model surfaces and feature edges and corners are recovered.

23 Claims, 5 Drawing Sheets

(51) Int. Cl.

| | |
|---|---|
| *G06T 17/10* | (2006.01) |
| *G06F 17/50* | (2006.01) |
| *B33Y 50/00* | (2015.01) |
| *G06T 15/04* | (2011.01) |
| *G06T 17/20* | (2006.01) |
| *G06T 19/20* | (2011.01) |
| *B29C 64/112* | (2017.01) |

(52) U.S. Cl.
CPC .............. *G06T 17/10* (2013.01); *G06T 17/20* (2013.01); *G06T 19/20* (2013.01); *B29C 64/112* (2017.08); *Y02P 90/265* (2015.11)

(58) Field of Classification Search
USPC ........................................................ 345/419
See application file for complete search history.

(56) References Cited

U.S. PATENT DOCUMENTS

| | | | |
|---|---|---|---|
| 5,579,407 | A | 11/1996 | Murez |
| 5,930,494 | A | 7/1999 | Akiyama |
| 6,035,059 | A | 3/2000 | Kurosawa et al. |
| 6,057,858 | A | 5/2000 | Desrosiers |
| 6,229,545 | B1 | 5/2001 | Satoh |
| 6,421,048 | B1 | 7/2002 | Shih et al. |
| 6,552,722 | B1 | 4/2003 | Shih et al. |
| 6,563,500 | B1 | 5/2003 | Kim et al. |
| 6,720,963 | B2 | 4/2004 | Yoshida et al. |
| 6,775,401 | B2 | 8/2004 | Hwang et al. |
| 6,792,398 | B1 | 9/2004 | Handley et al. |
| 6,831,640 | B2 | 12/2004 | Shih et al. |
| 7,010,164 | B2 | 3/2006 | Weese et al. |
| 7,084,883 | B2 | 8/2006 | Sasaki |
| 7,087,200 | B2 | 8/2006 | Taboas et al. |
| 7,102,635 | B2 | 9/2006 | Shih et al. |
| 7,259,761 | B2 | 8/2007 | Shih et al. |
| 7,283,134 | B2 | 10/2007 | Hoppe |
| 7,356,179 | B2 | 4/2008 | Young |
| 7,538,769 | B2 | 5/2009 | Hoppe |
| 7,762,814 | B2 | 7/2010 | van der Zel |
| 7,815,826 | B2 | 10/2010 | Serdy et al. |
| 7,864,173 | B2 | 1/2011 | Handley et al. |
| 7,899,241 | B2 | 3/2011 | Baxes et al. |
| 7,996,795 | B2 | 8/2011 | Moroz et al. |
| 8,355,020 | B1 | 1/2013 | Hanau et al. |
| 8,384,716 | B2 | 2/2013 | Young et al. |
| 8,458,188 | B2 | 6/2013 | Salemann |
| 8,576,222 | B2 | 11/2013 | Handley et al. |
| 8,576,224 | B2 | 11/2013 | Vandenbrande et al. |
| 8,587,587 | B2 | 11/2013 | Hanau et al. |
| 8,736,609 | B2 | 5/2014 | Brabec |
| 8,860,766 | B2 | 10/2014 | Moravanszky |
| 8,874,248 | B2 | 10/2014 | Young et al. |
| 8,983,646 | B1 * | 3/2015 | Hanna ..................... G06F 17/50 246/401 |
| 9,536,018 | B2 * | 1/2017 | Chow ..................... G06F 17/50 |
| 9,652,889 | B2 * | 5/2017 | Young ..................... G06T 17/10 |
| 9,821,517 | B2 * | 11/2017 | McGatha .............. B29C 64/386 |
| 2001/0033281 | A1 | 10/2001 | Yoshida et al. |
| 2002/0005856 | A1 | 1/2002 | Sasaki |
| 2002/0012462 | A1 | 1/2002 | Fujiwara |
| 2002/0122038 | A1 | 9/2002 | Cowperthwaite |
| 2003/0012419 | A1 | 1/2003 | Accomazzi |
| 2003/0128208 | A1 | 7/2003 | Shih et al. |
| 2004/0011231 | A1 | 1/2004 | Hall et al. |
| 2004/0170311 | A1 | 9/2004 | Accomazzi |
| 2005/0001831 | A1 | 1/2005 | Shih et al. |
| 2005/0055035 | A1 | 3/2005 | Cosman et al. |
| 2005/0062738 | A1 | 3/2005 | Handley et al. |
| 2006/0017749 | A1 | 1/2006 | McIntyre et al. |
| 2007/0009606 | A1 | 1/2007 | Serdy et al. |
| 2007/0014488 | A1 | 1/2007 | Chen et al. |
| 2007/0018973 | A1 | 1/2007 | Shih et al. |
| 2007/0057945 | A1 | 3/2007 | Olson |
| 2007/0279414 | A1 | 12/2007 | Vandenbrande et al. |
| 2008/0032083 | A1 | 2/2008 | Serdy et al. |
| 2008/0088620 | A1 | 4/2008 | Shih et al. |
| 2008/0317317 | A1 | 12/2008 | Shekhar et al. |
| 2009/0042167 | A1 | 2/2009 | Van Der Zel |
| 2010/0027861 | A1 | 2/2010 | Shekhar et al. |
| 2010/0226589 | A1 | 9/2010 | Mukherjee |
| 2011/0033887 | A1 | 2/2011 | Fang et al. |
| 2011/0076734 | A1 | 3/2011 | Zhou et al. |
| 2011/0076762 | A1 | 3/2011 | Serdy et al. |
| 2011/0102435 | A1 | 5/2011 | Brabec |
| 2011/0123794 | A1 | 5/2011 | Hiller et al. |
| 2011/0202538 | A1 | 8/2011 | Salemann |
| 2012/0058174 | A1 | 3/2012 | West et al. |
| 2012/0128739 | A1 | 5/2012 | Nygaard et al. |
| 2012/0219698 | A1 | 8/2012 | Steingart et al. |
| 2012/0330423 | A1 | 12/2012 | Lin et al. |
| 2012/0330635 | A1 | 12/2012 | Miga et al. |
| 2013/0063437 | A1 | 3/2013 | Hanau et al. |
| 2014/0375636 | A1 | 12/2014 | Young et al. |
| 2015/0367578 | A1 | 12/2015 | Arisoy et al. |

FOREIGN PATENT DOCUMENTS

| | | | |
|---|---|---|---|
| WO | 200221450 | A1 | 3/2002 |
| WO | 02073536 | A2 | 9/2002 |
| WO | 2004047030 | A2 | 6/2004 |
| WO | 2010039123 | A1 | 4/2010 |

OTHER PUBLICATIONS

Mezentsev AA, Woehler T. Methods and Algorithms of Automated CAD Repair for Incremental Surface Meshing. InIMR Oct. 10, 1999 (pp. 299-309).*

Chong CS, Kumar AS, Lee HP. Automatic mesh-healing technique for model repair and finite element model generation. Finite Elements in Analysis and Design. Nov. 1, 2007;43(15):1109-19.*

Yang J, Han S, Park S. A method for verification of computer-aided design model errors. Journal of Engineering Design. Jun. 1, 2005;16(3):337-52.*

Attene M. et. al. "Edge-Sharpener Recovering sharp features in triangulations of non-adaptively re-meshed surfaces," GVU Tech Report. ACM Symposium, May 2003, p. 1-8.

Attene M. et. al. "Sharpen&Bend: Recovering Curved Sharp Edges in Triangle Meshes Produced . . . " IEEE Transactions on Visualization and Computer Graphics, vol. 11, No. 2, Mar./Apr. 2005.

Kobbelt, et al., "Geometric Modeling Based on Polygonal Meshes," Eurographics, Jul. 2000, 48 pages.

Wang, C. "Incremental reconstruction of sharp edges on mesh surfaces," Computer-Aided Design vol. 38, Jun. 2006, pp. 689-702.

U.S. Appl. No. 14/283,934—Notice of Allowance dated Jan. 12, 2017, 5 pages.

U.S. Appl. No. 14/283,934—Office Action dated Sep. 24, 2015, 14 pages.

U.S. Appl. No. 14/283,934—Response to Office Action dated Sep. 24, 2015 filed Jan. 25, 2016, 11 pages.

U.S. Appl. No. 14/283,934—Final Office Action dated Apr. 20, 2016, 13 pages.

U.S. Appl. No. 14/283,934—Response to Final Office Action dated Jul. 20, 2016, filed Jul. 20, 2016, 15 pages.

U.S. Appl. No. 14/283,934—Response to Office Action dated Aug. 25, 2016, filed Nov. 25, 2016, 11 pages.

Avci et al., "Three-dimensional TCAD Process and Device Simulations," University Government Industry Microelectronics, Symposium (Jun. 2005), 6 pages.

Baker T., "Mesh Movement and Metamorphosis," Engineering with Computers, vol. 18:3 (2002) 10 pages.

Balmelli et al., "Volume warping for adaptive isosurface extraction," IEEE Visualization 2002, Boston, USA (Oct. 2002), pp. 467-474.

Deal et al. "General Relationship for the Thermal Oxidation of Silicon" Journal of Applied Physics, vol. 36, No. 12, Dec. 1965, pp. 3770-3778.

(56) References Cited

OTHER PUBLICATIONS

Calvert, "Inkjet Printing for Materials and Devices", 2001, Chem. Mater, vol. 13, pp. 3299-3305.
Carpendale et al. "A Framework for Unifying Presentation Space", UIST'01 ACM p. 61-70, Nov. 2001.
Chalasani S. et al., "Quality improvements in extruded meshes using topologically adaptive generalized elements," Int. J. Numer. Meth. Engng 2004; 60:1139-1159.
Chandru et al., "Voxel-Based Modeling for Layered Manufacturing," Nov. 1995, Rapid Prototyping Technology, pp. 42-47.
Chen et al. "Construction of an objective function for optimization-based smoothing", Engineering with Computers, 20: p. 184-192, 2004.
Cheng S-W., et al., "A Practical Delaunay Meshing Algorithm for a Large Class of Domains," Proc. Intl. Meshing Roundtable (2007) 18 pages.
Crostack et al., "Tomographic Analysis and FE-Simulations of MMC-Microstructures under Load," Proceedures of SPIE, 2006, vol. 6318, 12 pages.
Dey T., et al., "Delaunay Meshing of Piecewise Smooth Complexes without Expensive Predicates," Algorithms, vol. 2, Issue 4 (2009), 22 pages, doi:10.3390/a2041327. Technical report OSU-CISRC-7108-TR40, Jul. 2008.
Dheeravongkit A. et al., "Inverse Pre-deformation of Finite Element Mesh for Large Deformation Analysis," Proc. 13th Intl. Meshing Roundtable, 2004, pp. 81-94.
Fiedler R.A. et al., "Simulations of Slumping Propellant and Flexing Inhibitors in Solid Rocket Motors," Center for Simulation of Advanced Rockets, Amer. Inst. Aeronautics and Astronautics Paper 4341, 2002, 11 pages.
Gabbrielli et al., "Development of Modelling Methods for Materials to be Used as Bone Substitutes," Nov. 2007, Key Engineering Materials, vol. 361-363 (2008), pp. 903-906.
Giraud-Moreau L. et al., "A Remeshing Procedure for Numerical Simulation of Forming Processes in Three Dimensions," ed. Pebay P., Proc. 15th Intl. Meshing Roundtable, 2006, Session 1B, pp. 127-143.
Guoy D., et al., Chapter 5B.1, "Parallel Mesh Adaptation for Highly Evolving Geometries with Application to Solid Propellant Rockets," ed. Brewer M., Proc. 16th Intl. Meshing Roundtable, 2008, Session 5B, pp. 515-534.
Hiller et al., "Methods of Parallel Voxel Manipulation for 3D Digital Printing," (http://w w w .mae.cornell.edu/ccsl/papers/SFF07.sub.-Hiller.pdf, Proceedings of the 18th Solid Freeform Fabrication Symposium, Austin TX, Aug. 2007, 12 pages.
Hiller et al., "Tunable Digital Material Properties for 3D Voxel Printers," (http://w w w .mae.cornell.edu/ccsl/papers/SFF08.sub.-Hiller.pdf), Proceedings of the 19th Solid Freeform Fabrication Symposium, Austin TX, Aug. 2008, pp. 33-44.
Hiller, J., "Rapid Assembly for Physical Voxel Fabrication (Digital Materials)", 2010, Cornell Creative Machines Lab, 3 pages, "http://creativemachines.cornell.edu", accessed Oct. 29, 2013.
Hiller et al., "Fully Recyclable Multi-Material Printing," Solid Freeform Fabrication Symposium (SFF'09), Aug. 3-5, 2009, Austin, TX, USA.
Hiller et al., "Design and analysis of digital materials for physical 3D voxel printing," http://ccsl.mae.cornell.edu/sites/default/files/RPJ09.sub.-Hiller.pdf,Rapid Prototyping Journal, vol. 15, No. 2, 2009, pp. 137-149.

Kao D-B. et al., "Two-Dimensional Silicon Oxidation Experiments and Theory," paper 14.6, IEDM 1985, 6 pages, with better copies Figs. 2(a), 2(b) and 3 appended.
Kaufman et al., "3D Scan-Conversion Algorithms for Voxel-Based Graphics," Oct. 23-24, 1986, 1986 Workshop on Digital Graphics, pp. 45-75.
Yamaba et al, "Color Character Recognition Method Based on Human Perception", Optical Engineering, Soc. of Photo-Optical Instrumentation Engineers, Bellingham, US, vol. 32, No. 1, 1993, pp. 33-40.
Keyak et al., "Automated three-dimensional finite element modeling of bone: a new method," J Biomed Eng 12(5): 389-397 (Sep. 1990).
Moroz, V. et al., "Modeling the impact of stress on silicon processes and devices," Materials Science in Semiconductor Processing, vol. 6(1-3), Feb.-Jun. 2003, pp. 27-36.
Muller et al., "Three-dimensional finite element modeling of noninvasively assessed trabecular bone structures," Med. Eng. Phys., 17(2): 126-133, Mar. 1995.
Pasko et al., "Modelling and Visualization of Microstructures", 2010, SV-Journal.com, 9 pages.
Patent Abstracts of Japan, vol. 016, No. 003, Jan. 7, 1992 and JP 03-225477 A, Oct. 4, 1991.
Patent Abstracts of Japan, vol. 016, No. 398, Aug. 24, 1992 and JP 04-130978 A, May 1, 1992.
Senez et al., "3-Dimensional Simulation of Thermal Diffusion and Oxidation Process," Tech. Dig.—Int. Electron Devices Meet (1996), 4 pages.
Sentaurus Process User Guide, Version E-2010.12, Dec. 2010, Synopsys, Inc., title page, copyright page, and pp. 591-605.
Simeonov S., et al., "Investigation of Proximity Effects in a 6T SRAM Call Using Three-Dimensional TCAS Simulations," IEEE Trans. on Electron Devices, vol. 58:4, Apr. 2011, pp. 1189-1196.
Strecker N. et al., "A 3D moving grid algorithm for process simulation," J. Comp. Elec., vol. 5:4 (2006) pp. 297-300; ed. Kosina H., Special Section: Special Issue on the Proc. of the Intl. Workshop on Computational Electronics (IWCE-11) Part 1.
Synopsys, Inc., "Three-dimensional Simulations of Strained-Silicon CMOS Devices," (2007) 6 pages, www.synopsys.com/Tools/TCAD/CapsuleModule/cmos_devices.pdf, visited May 25, 2012.
Synopsys, Inc., Sentaurus Process release E-2010.12, 17 pages (Dec. 2010).
Synopsys, Inc., Sentaurus Process release F-2011.09 (Sep. 2011), 1086 pages.
Tan Z. et al., "CFD-Micromesh: A Fast Geometric Modeling and Mesh Generation Tool for 3D Microsystem Simulations," Technical Proc. of the 2000 Int'l Conf. on Modeling and Simulation of Microsystems, Mar. 2000, Ch. 17, 4 pages.
Victor Moroz et al. "Modeling the Impact of Stress on Silicon Processes and Devices" Materials Science in Semiconductor Processing 6 (2003), pp. 27-36.
Villablanca, "Mesh Generation Algorithms for Three-Dimensional Semiconductor Process Simulation," Series in Micorelectronics, vol. 97, Chapter 5 (2000), pp. 55-76.
Wan J. et al., "Automated Adaptive Forming Simulations," Proc. 12th Intl. Meshing Roundtable, 2003, 12 pages.
Wu, "From CT Image to 3D Model, Thanks to New 3D Imaging Software, Surgeons Can Now Create Physical Models of their Patients' Inside", Aug. 2001, 3 pages.
Yagel et al., "Normal Estimation in 3D Discrete Space," 1992, The Visual Computer, vol. 8, pp. 278-291.

\* cited by examiner

IMAGE PROCESSING METHOD

PRIORITY APPLICATION

This application is a continuation of U.S. patent application Ser. No. 14/283,934 filed on 21 May 2014, which application claims the benefit of priority under 35 U.S.C. § 119 of GB 1311293.3, filed 25 Jun. 2013, both of which are hereby incorporated by reference in their entirety.

FIELD OF THE INVENTION

The invention relates to computer-assisted methods for the preparation of images for further processing. For example, the prepared images can be for use in subsequent analysis techniques, such as finite element analysis or computational fluid dynamic (CFD) analysis, or as a more robust image for computer-assisted design (CAD) manipulation. In another example, an image can be prepared for use in a manufacturing process, such as three-dimensional printing, CNC machining, injection moulding or the like.

BACKGROUND TO THE INVENTION

CAD models are often constructed in a way that makes certain types of subsequent processing, such as the creation of real physical models (e.g., by three-dimensional printing or rapid prototyping) or volume and surface meshes, not possible without manual intervention. Often this can arise because some applications, such as visualization, have less stringent requirements for the CAD model than other applications. CAD models which do not meet the requirements of a given process are often referred to as having defects or invalid geometries. Correcting the defects in CAD models so that they are suitable for the subsequent processing is sometimes termed "fixing" or "healing" the CAD data.

Herein we use the term "CAD model" to mean any conventional boundary representation of a three-dimensional geometry, either through the use of NURBS, polygons or other surface representations.

Examples of invalid geometries include:

(1) Surface mismatch, where the surface patches or polygons which make up the boundary representation create a small gap or overlap at shared edges in the surface (even though they may visually appear to conform). This can occur even when the vertices of the shared edge are the same if the polynomial order of interpolating function differs from patch to patch. Models with this type of invalid geometry are sometimes referred to as not being watertight or closed.

(2) Holes, where the edges and/or vertices of adjacent surface patches or polygons which make up the boundary representation are not shared. Models with this type of invalid geometry are also sometimes referred to as not being watertight or closed.

(3) Shell surfaces, where the model includes one or more surfaces which do not enclose a finite volume, i.e., they simply define a two-dimensional entity in space, with no solid region or thickness. Whilst such a surface can be clearly visualized, it cannot be used for a number of applications, such as generating a rapid prototyped model or a volume mesh, for which a closed model with a finite volume is required.

Another potential problem can be the complexity of CAD models, e.g., CAD models which include many detailed features such as short edges, fillets, etc. Such highly detailed features can present a challenge to generating a mesh for subsequent Computer Aided Engineering (CAE) analysis techniques such as modelling using finite element analysis (FEA) and computational fluid dynamics (CFD) because they introduce additional complexities, e.g., increased processing time and memory usage, more challenging meshing, etc. In many circumstances, the detailed features are not required for analysis purposes, and therefore a solution is to manually remove them from the CAD model. This process is known as "CAD de-featuring".

A further problem may arise where a CAD model comprises multiple (two or more) interrelated component parts, where each component part is represented by a separate (independent) CAD model. For example, the component parts may make up an assembly which need to be agglomerated or concatenated to form a single CAD model. In one example, the component parts can be an engine block, inlet and exhaust manifolds, and pistons, which together form a car engine assembly. In other examples one of the interrelated component parts can be subtracted from another, e.g., the interrelated component parts can be a model of a femur bone and a reaming tool, whereby the combined CAD model is obtained by subtracting the reaming tool from the bone. For the purposes of further processing, it can be desirable to generate either a single or several new CAD models in which the component part CAD models are combined, e.g., based on Boolean operations (union, intersection, etc.). For example, it can be desirable to analyse air flow over the complete car engine assembly or to perform finite element analysis on bone after the reaming tool is subtracted.

However, the result of the Boolean operations in CAD space may introduce defects in the resulting CAD model due to differences in geometry of surfaces of the component parts which are intended to interact with one another, e.g., by contact, mating, etc. For example, surface patches or polygons which make up the boundary representation at interfaces between components typically will not be perfectly conforming, thereby creating gaps or overlaps. These defects can be a result of the CAD models for the component parts being generated on separate systems, e.g., different CAD programs or on the same system without direct regard to one another. These defects may need to be manually fixed before processing of the new CAD model can take place.

A number of tools exist for addressing the problems either by operating directly on the CAD model or by creating a new CAD model using for example a "shrink wrapping" process. However these approaches can be difficult to user may require considerable user interaction and may not give desired results. One example of such a tool is CADfix® by International TechneGroup Incorporated.

SUMMARY OF THE INVENTION

At its most general, the present invention proposes a technique for selectively recovering the features of an original CAD model after the original CAD model has been converted to a digitized image and a new CAD model generated from the digitized image. The method is implemented by a computer using code executing in a processor thereof with reference to the contents of one or more memory devices. The original boundary representation can be effectively used as a template to transform the representation through processing under governance of a programmed processor so as to recover accuracy and reintroduce feature edges and feature corners as well as other detailed features to the CAD model obtained from the digitized image, e.g., to enable detailed features to be retained that would otherwise be lost due to the lossy conversion into image space. The enhanced method implemented in accordance with one or more embodiments of the present invention can better ensure that reconstructed boundary vertices lie on original CAD model surfaces and feature edges and corners are recovered.

Thus, according to one aspect of the invention, there can be provided a computer-implemented method of generating a representation of a virtual three-dimensional object in a computer having a processor and a memory device, the method comprising, through the use of code executing in the processor to configure the processor perform several steps of the method in conjunction with the memory device which can store the representation, the following: obtaining into the memory device a master boundary representation of the virtual three-dimensional object; sampling using code executing in the processor a bounding volume containing the master boundary representation to generate a digitized three-dimensional representation of the object in the memory device; generating using code executing in the processor a slave boundary representation from the digitized three-dimensional representation of the object, the slave boundary representation being in the memory device; modifying using code executing in the processor the slave boundary representation with reference to the master boundary representation to make the slave boundary representation more similar to the master boundary representation. The aim of the 35 modifying step can be to bring the overall geometry of the slave boundary representation closer to that of the master boundary representation, i.e., so that it appears exactly the same as the master boundary representation. Thus, the modifying step can enable the slave boundary representation to more accurately resemble the master boundary representation and/or can reintroduce one or more features of the master boundary representation.

The method can be for preparing a virtual three-dimensional object to be suitable for three-dimensional printing, or for further Computer Aided Engineering (CAE) analysis techniques, such as FEA and CFD.

Herein, the term "boundary representation" means a CAD model in any suitable format, e.g., data representative of a surface in three dimensions, e.g., defined using a NURBS mathematical model, a plurality of polygonal surfaces or a volume mesh.

The process of converting the master boundary representation to image data and then reconstructing a surface from the image data inevitably leads to geometric inaccuracy in the reconstructed surfaces and a loss of feature edges and feature corners. The method of the invention therefore includes modifying the slave boundary representation to reintroduce a feature (or a plurality of features) of the master boundary representation. Thus, by referencing back to the master boundary representation (i.e., the original CAD model), geometric accuracy/fidelity and key features can be recovered. In this context, a feature can be any aspect of the shape or configuration of the master boundary representation, e.g., the position of its surfaces, the nature of its edges or corners, etc.

Modifying the slave boundary representation can be done to align or register a surface on the slave with a corresponding surface on the master boundary representation, and/or to recreate detailed edges or corners that are lost in the sampling process. Thus, embodiments of the present invention include code executing in a processor to configure the processor perform actions, such as modifying, comparing, mapping, and so on, in conjunction with data stored, changed, and generally maintained the memory device. For instance, modifying the slave boundary representation can comprise: comparing using code executing in the processor the slave boundary representation with the master boundary representation; and mapping using code executing in the processor a displaced portion of the slave boundary representation to a modified position to match the corresponding portion of the master boundary representation.

Herein, displaced portion means a part of the slave boundary representation that is not in the same position as the corresponding part of the master boundary representation. In practice, the process of generating the slave boundary representation means that the master boundary representation and the slave boundary representation share a common frame of reference. If this is not the case, the comparing step can include co-registering the master boundary representation and the slave boundary representation. As mentioned above, the displaced portion can be a surface, edge, or corner.

Mapping the displaced portion can comprise moving a plurality of points on the slave boundary representation in the memory to respective locations on the co-registered master boundary representation in the memory device using code executing in the processor. This can be a technique for registering a surface or an edge or a corner of the slave boundary representation with the master boundary representation. The method can include selecting one or more features on the master boundary representation to which corresponding portions of the slave boundary representation are to be mapped.

Each of the plurality of points can be moved on to the surface of the master boundary representation that is closest to it in a direction normal to the surface of the master boundary representation. Alternatively, each of the plurality of points can be moved on to the surface of the master boundary representation that is closest to it in a direction normal to the surface of the slave boundary representation. For example, the slave boundary representation can comprise a plurality of contiguous polygons, and wherein each of the plurality of points can be a vertex at the intersection between two or more of the plurality of contiguous polygons.

Alternatively, the slave boundary representation can comprise a volume mesh having a plurality of contiguous cells, and wherein each of the plurality of points is a vertex at the intersection between two or more of the plurality of contiguous cells.

In another embodiment, the slave boundary representation can comprise a NURBS surface, and wherein each of the plurality of points is a grid point on the NURBS surface.

Mapping the displaced portion can comprise spawning a new point on the slave boundary representation, wherein moving the plurality of points comprises moving the new point. For example, where the slave boundary representation can comprise a plurality of contiguous polygons, a new point can be spawned by dividing a polygon in the displaced portion to spawn a new vertex, wherein moving the plurality of points comprises moving the spawned vertex. The technique can be particularly useful for corners and edges, as it can reduce the magnitude of distortion of the polygons in the displaced region.

The displaced portion can be any of a surface, an edge and a corner.

The method can include outputting the modified slave boundary representation, e.g., for display on an output device associated with the computer or further processing by the computer or another machine. For example, the modified slave boundary representation can be communicated to a three-dimensional printer or CNC machine. The modified slave boundary representation can also be suitable for further operations in polygonal (i.e., CAD) space, e.g./adaptive decimation, generating volume meshes, converting to higher order NURBS surfaces, etc.

The step of generating a slave boundary representation from the digitized three-dimensional representation of the object can use any conventional surface reconstruction technique implemented as code executing in the processor to configure the processor to implement such technique, e.g., an isosurfacing technique such as the marching cubes algorithm. The slave boundary representation can thus comprise one or more closed polygonal surfaces, which in turn can be formed from a plurality of contiguous polygons. If the object comprises a plurality of component parts which are intended to conform with one another, generating the slave boundary representation can comprises using the multi-part marching cube algorithm to ensure conformity at all part interfaces.

Alternatively, the step of generating the slave boundary representation can comprise generating a volume mesh of the digitized three-dimensional representation, e.g., using any known technique such as advancing front or Delaunay meshing.

The method can include manipulating the digitized three-dimensional representation before generating the slave boundary representation. Manipulating the digitized three-dimensional representation can include digitally altering or de-featuring a region of the digitized three-dimensional representation of the object.

Herein, digital altering means any technique for changing the image data obtained from the sampling step. For example, the image data can be altered using known image processing techniques implemented using suitable code executing in the processor, such as paint/unpaint, filtering, smoothing, flood filling, etc. Alternatively or additionally, the step of digitally altering can comprise performing a morphological operation.

If the object is an assembly of sub-components, digital altering can comprise joining the sub-components, e.g., by connecting regions (e.g., voxelized volumes) in the digitized three-dimensional representation that are intended to be in contact or joined, again, using code executing in the processor. The surfaces can be joined by filling or morphological closing operations. Alternatively or additionally, if the object is an assembly of sub-components, the digital altering step can comprise performing one or more Boolean operations using code executing in the processor to configure the processor to implement such an operation (or other algorithm), e.g., union or intersection, to effectively merge the sub-components into a single object or to create different new modified components. This technique can be particularly useful if it is desirable to model the interaction between the original CAD model and a separate image. Boolean operations can be used on the digitized three-dimensional representation and the separate image, before converting the result back to form the slave boundary representation. The Boolean operations can act to split the digitized image representation or to amalgamate or concatenate it with the separate image.

Manipulating the digitized three-dimensional representation can be for the purpose of healing defects in the master boundary representation. The method can thus include identifying an invalid portion of the master boundary representation; and selecting a healing technique to be applied based on the identified invalid portion using code executing in the processor, wherein digitally altering a region of the digitized three-dimensional representation comprises code executing in the processor to configure the processor to implement a healing technique or algorithm to heal defects in the master boundary representation in the memory unit.

There can be a number of available healing techniques that can be applied, depending on the type of defect, each implementable using code executing in the processor to configure the processor to apply such technique. The method can therefore include: identifying an invalid portion of the master boundary representation; and selecting the healing technique to be applied based on the identified invalid portion. In some circumstances, explained below, the act of converting the master boundary representation into a digitized image, i.e., the step of sampling the bounding volume containing the master boundary representation, can in itself result in obtaining the healed digitized three-dimensional representation. The sampling process itself is lossy, which means that detail can be lost from the master boundary representation. If the defects exist at the level of detail that is lost, i.e., they have dimensions of the same order of magnitude of the sampling rate or less, they can be healed by the sampling process itself.

The region that is digitally altered can correspond to the identified invalid portion of the master boundary representation.

The digitized three-dimensional representation of the object can comprise a voxelized model of the virtual three-dimensional object, e.g., obtained by a conventional voxelization process using code executing in the processor to configure the processor to implement that process. The step of digitally altering a region of the digitized three-dimensional representation can thus comprise painting the region to add or remove voxels in the digitized three-dimensional representation.

The identified invalid portion can include a gap in the master boundary representation. For such an invalid portion, the selected healing technique can include selecting a sampling spacing that is greater than the magnitude of the gap. As mentioned above, this can result in the healed digitized three-dimensional representation of the object being automatically obtained from the step of sampling the bounding volume to create the digitized representation.

The identified invalid portion can include an overlap of bounding surfaces in the master boundary representation. For such an invalid portion, the selected healing technique includes selecting a sampling spacing that is greater than the magnitude of the overlap, i.e., the distance between the two overlapping surfaces. As mentioned above, this can result in the healed digitized three-dimensional representation of the object being automatically obtained from the step of sampling the bounding volume to create the digitized representation.

The conversion into image data, i.e., the sampling stage, can be performed using any standard technique. For example, the sampling step can include a binary voxelization step, where voxels in the image data are marked, e.g., by code executing to update the contents of the memory device, as either inside or outside the master boundary representation. This technique can be appropriate for closed surfaces or surfaces with gaps smaller than the sampling rate.

Alternatively or additionally, the sampling step can be include code executing in the processor to assign values to the voxels based on a signed distance function, where voxels near the surface of the master boundary representation are assigned values which reflect their distance to that surface. Voxels inside the master boundary representation are given negative values, whereas those outside are given positive values. This technique may also be appropriate (and more accurate) for closed surfaces or surfaces with gaps smaller than the sampling rate. But additional requirement for running this technique successfully is the ability to distinguish whether sampling points lie inside or outside the object. This breaks for shell surfaces because there are then no points 'inside' the geometry.

Alternatively or additionally, the sampling step can include code executing in the processor to assign values to the voxels based on an unsigned distance function, where voxels near the surface of the master boundary representation reflect their distance to that surface without any distinction between what is inside and what is outside. Thus, the voxels that are far away from the surface are given low values. This technique may provide a solution to the problem of shell surfaces because it permits extraction of an isosurface at a given distance from the surface of the master boundary representation (i.e., the shell), which is thus effectively given an arbitrary thickness. This technique thus provides an alternative in image space to the step of extruding the shell surface (to create an offset) on the master boundary representation (i.e., in CAD space).

Thus, the identified invalid portion may include a shell. For such an invalid portion, the selected healing technique may include sampling the bounded volume using code executing in the processor to configure the processor to apply an unsigned distance function to a region of the bounding volume that includes the invalid portion. The healing technique can include extracting an isosurface from the digitized three-dimensional representation of the object, the isosurface defining a volume corresponding to (e.g., enclosing or mimicking) the shell. The method can include a step of thinning the isosurface so that it better conforms to the original shell. If the shell is closed, i.e., completely encloses a finite volume, this can be done by flood filling the isosurface in image space and then eroding one of more voxel layers from the isosurface, using code executing in the 25 processor.

The above healing techniques can be applied alone or in any combination. Thus, the healing technique may represent a hybrid of any or all of the techniques mentioned above. For example, different parts of the master boundary representation can be voxelized using different methods. Providing each part is voxelized at the same sample rate or, where spatially distinct, an appropriate transitioning scheme is used, the individual volumes can be unioned to produce a final volume representing the entire model.

The digitized three-dimensional representation of the object is effectively an approximate bitmapped representation of the master boundary representation, wherein the degree of approximation can be controlled by selecting the sampling rate.

As explained above, once the object is represented in image space, additional image manipulation (i.e., additional to the sampling process itself) can be performed. In addition to the techniques discussed above, the digitized representation may also be subject to localized smoothing or Boolean operations in order to de-feature (i.e., simplify) a geometry.

The invention may also be expressed as a computer program product comprising a non-transitory computer-readable storage medium having software instructions stored thereon, the software instructions being executable by a computer to perform the steps of any of the methods outlined above.

In a second aspect, the invention can provide a method of manufacturing a physical model, the method comprising: inputting a master boundary representation of the virtual three-dimensional object; sampling a bounding volume containing the master boundary representation to generate a digitized three-dimensional representation of the object; generating a slave boundary representation from the digitized three-dimensional representation of the object; modifying the slave boundary representation with reference to the master boundary representation to make the slave boundary representation more similar to the master boundary representation; outputting the slave boundary representation to a manufacturing unit; and operating the manufacturing unit to create a physical model corresponding to the slave boundary representation. The manufacturing unit can be a three-dimensional printer, CNC machine or the like. Any of the steps of the first aspect can also be applied to the second aspect.

The disclosure herein also defines a computer-implemented method of correcting a defective representation of a virtual three-dimensional object in a computer having a processor and a memory device, the method comprising: either obtaining or inputting into the memory device a master boundary representation of a virtual three-dimensional object; healing defects in the master boundary representation using code executing in the processor to configure the processor to apply a healing technique that comprises: sampling a bounding volume containing the master boundary representation to generate a digitized three-dimensional representation of the object, and obtaining a healed digitized three-dimensional representation of the object; and generating using code executing in the processor a slave boundary representation from the healed digitized three-dimensional representation of the object. This method teaches applying a healing technique which takes the master boundary representation into image space, where a healed version is obtained and then converted back to the slave boundary representation.

BRIEF DESCRIPTION OF THE DRAWINGS

Examples of the invention as discussed in detail below with reference to the accompanying drawings, in which.

DETAILED DESCRIPTION OF CERTAIN EMBODIMENTS OF THE INVENTION; FURTHER OPTIONS AND PREFERENCES

Figure 1A:
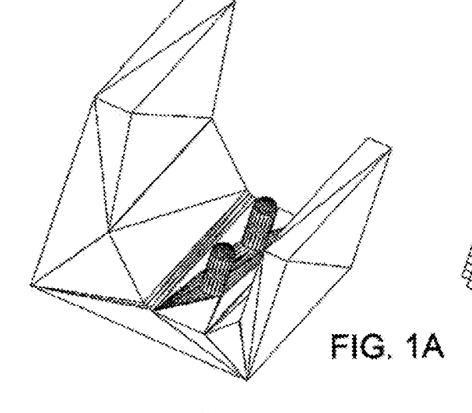
FIGS. 1A to 1F illustrate the effect of various steps of a method that is an embodiment of the invention on a virtual three-dimensional object.

An overview of a method that comprises one an embodiment of the invention is discussed first with reference to FIGS. 1A to 1F. FIG. 1A shows the master boundary representation of a virtual three-dimensional object, also referred to below as the original CAD model. This can be obtained from or created by any conventional CAD software package, and the representation is rendered on a display or other output associated with a computer which includes at least one processor configured by code executing therein to provide the functionality and transformations of data maintained in a non-transitory memory device, as discussed in this specification.

The code utilized by one or more embodiments of the present invention comprise instructions that control the processor of the computer to execute methods, such as detailed in FIGS. 7 and 8 below. The instructions can comprise a program, a single module, or a plurality of modules that operate in cooperation with one another. More generally, the code comprises a portion of an embodiment implemented as software. The module(s) that comprise a software embodiment can include anything that can be executed by a computer such as, for example, compiled code, binary machine level instructions, assembly code, source level code, scripts, function calls, library routines, and the like. In other embodiments, the code can be implemented in firmware or a hardware arrangement.

Figure 1B:
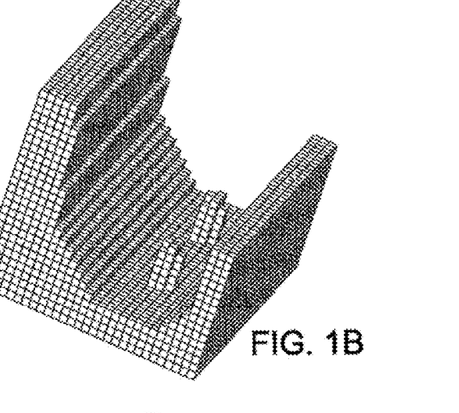

FIG. 1B shows the result of converting the CAD model into digital image data. Thus, FIG. 1B is a digitized three-dimensional representation of the object, rendered using the digitized data in the memory device. In this example, the original CAD model is voxelized. As can be seen in FIG. 1B, voxelization is a lossy technique, so the process de-features the original CAD model. The amount of de-featuring depends on the chosen sampling rate. For solid objects, as the sampling rate increases, the image representation (and in particular any boundary representation extracted by isosurfacing the image representation) will converge to the original CAD model, but finer digitization can lead to significant computational costs both in terms of CPU time and memory.

In some embodiments, the inherent approximation in the digitization can itself resolve problems with the original model. For example, in the case where there exists poorly conforming surfaces, a sampling rate can be chosen such that invalid portions of the original CAD model are not captured.

CAD models can be converted into images data (voxelized/digitized) using a number of different methods implemented in code and provided to the processor to configure the processor accordingly, each of which is suitable for different kinds of model. The following techniques can be used with one or more embodiments of the invention:

(1) Binary voxelization: voxels in the image data are marked as either inside or outside of the CAD model.

(2) Signed distance function: voxel values reflect their distance to the surface. Those inside are given negative values, those outside are given positive values.

(3) Unsigned distance function: voxel values near the surface of the CAD reflect their distance to the surface. Those far away are given low values. No distinction is made between inside and outside. This technique allows a shell surface to be given a real thickness, e.g., by extracting an isosurface at a given distance.

(4) Unsigned distance function with erosion: as for (3) above, followed by a flood fill and erosion to reduce the thickening effect so that the isosurface lies more closely to the original surface.

(5) Hybrid: some combination of the above. Different parts of a CAD model can be voxelized using different methods. Providing each part is voxelized at the same sample rate or, where spatially distinct, an appropriate transitioning scheme is used, the individual volumes can be unioned to produce a final volume representing the entire model.

Figure 1C:
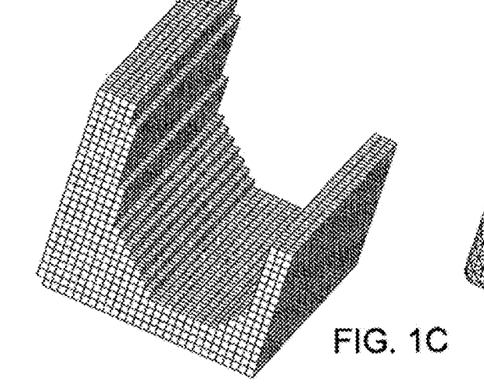

FIG. 1C shows a modified (i.e., digitally altered) version of the digitized representation of the object in the memory device as a result of the transformative techniques noted above. The purpose of the modification can be manifold. For example, the modification can be for healing invalid portions of the original CAD model. However, the modification process can also be used on valid CAD models, e.g., to defeature or edit the CAD to remove features that are unwanted or unnecessary for subsequent processing, or to perform Boolean operations with other images. These other images can themselves be digitized version of CAD models or they can be original digital data, e.g., obtained by a scanning a real object or physical volume. The modification step can thus be a technique for healing invalid CAD models, or for combining the original CAD model in some way with other image data, or simply for editing the original CAD model to prepare it for subsequent processing. In this example, the modification comprises removing (e.g., painting out) two small projections on a surface of the object. In other embodiments, other types of known image-based operators can be used, e.g., morphological operators (e.g., dilate, erode, close and open), manual painting, image filtering, etc. Localized smoothing or Boolean operations can be used to de-feature a geometry. Invalid portions of the original CAD model can be corrected in this manner.

Figure 1D:
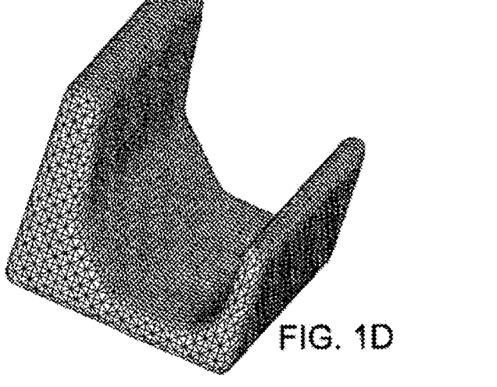

FIG. 1D shows a slave boundary representation, i.e., a healthy new CAD model, obtained by converting the healed version of the digitized representation using any known surface reconstruction technique by application of code in a suitably configured processor, e.g., the marching cubes or other algorithm can be used to extract an isosurface from the image data in the memory device. This will result in one or more closed polygonal surfaces being produced. Where several conforming but distinct image models then multi-part marching cube algorithm can be used which will ensure conformity at all part interfaces (i.e., no gaps/overlaps). The slave boundary representation is a near approximation of original surfaces. To bring the slave boundary representation closer to the master boundary representation (original CAD model), further correction techniques are needed. In this embodiment, these further corrections are performed by referring to the surfaces of the original CAD model.

Figure 1E:
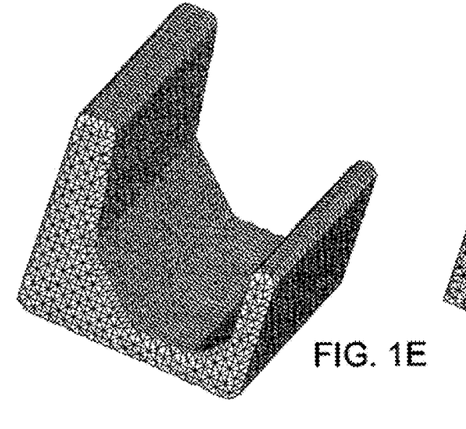

FIG. 1E shows a modified version of the slave boundary representation in which the planar surfaces of the original CAD model are recovered by moving vertices on the slave boundary representation by application of code in a suitably configured processor. Typically, the vertices of the polygons forming the reconstructed surface model will not lie exactly on the polygon(s) in the original CAD model by virtue of the process. How close they lie to original surface will depend on how fine a sampling rate was chosen for digitization. However, for example, by finding the shortest distance from a vertex on the new surface to the original/master surface and moving vertex to that point and repeating this for every polygon vertex will recover surface accuracy.

The objective of surface recovery is to reduce the spatial discrepancy between the original CAD model and the reconstructed surface. The surface recovery algorithm operates through code executing in the processor and involves updating the position of each vertex in the reconstructed surface to an appropriate/suitable position (generally the closest point) on the CAD model. This technique is discussed in more detail with reference to FIGS. 2, 3 and 7 below.

Figure 1F:
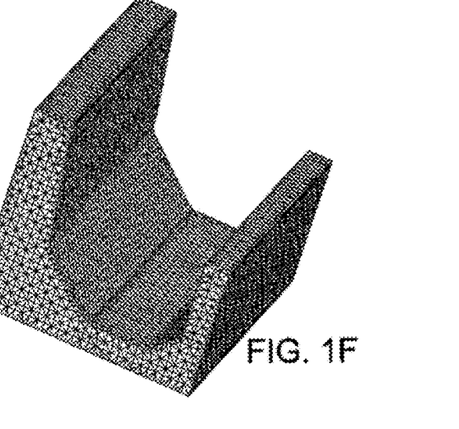

FIG. 1F shows the result of carrying out a similar correction technique to transform the representation in the memory device and thereby recover feature edges and corners of the original CAD model by application of code in a suitably configured processor. The surface recovery technique used to obtain the modified slave boundary representation in FIG. 1E is effective in recovering flat or smooth surfaces, but leaves behind bevelled facets in the slave boundary representation in place of sharp features in the CAD model. By referencing the bevelled edges or corners to corresponding edges or corner in the original CAD model, these detailed features can be recovered by moving existing vertices or spawning new vertices which are then moved to the position of the original edge or corner. This technique is discussed in more detail with reference to FIGS. 4 to 6 and 8 below.

Figure 2A:
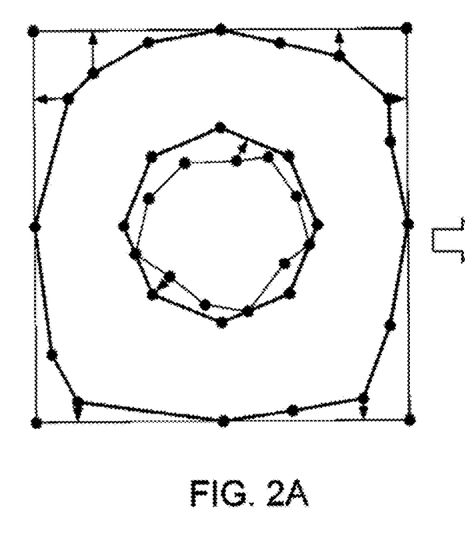
FIGS. 2A and 2B illustrate the steps of registering an edge on a 2D slave boundary representation with an edge on a 2D master boundary representation.
Figure 2B:
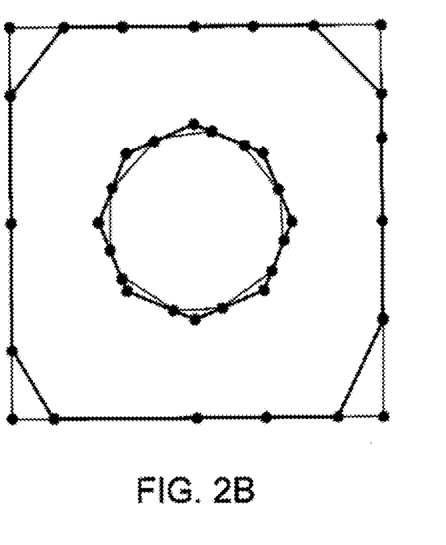
Figure 3:
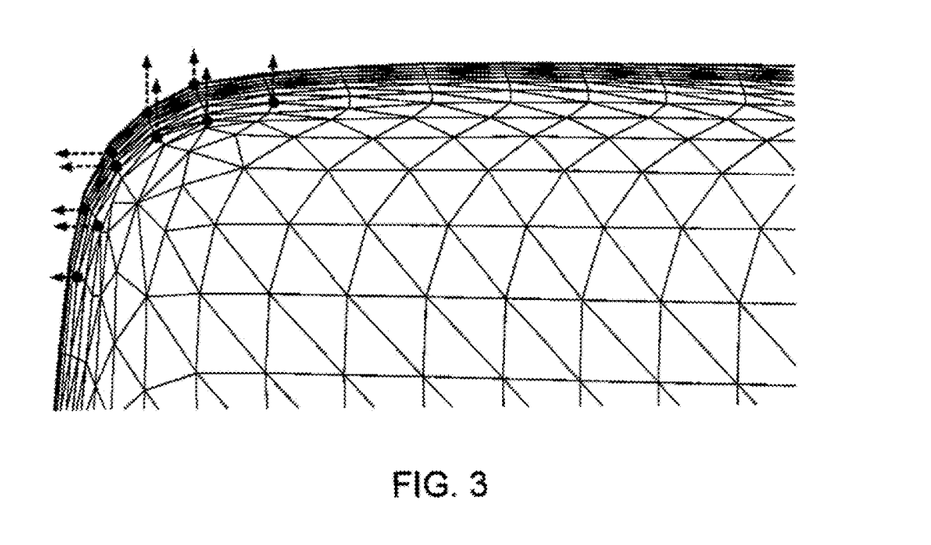
FIG. 3 illustrates the step of registering a surface on a 3D slave boundary representation with a surface on a 3D master boundary representation.

The technique of modifying the slave boundary representation to recover surfaces (e.g., planar surfaces) from the original CAD model is discussed now with reference to FIGS. 2 and 3. The objective of surface recovery is to eliminate the spatial discrepancy between the original CAD model and the surface vertices of the slave boundary representation. The surface recovery technique involves configuring the processor of the computer to compare the slave boundary representation with the original CAD model, and update the position of each vertex in the slave boundary representation to an appropriate point (e.g., the closest point, and generally not an original vertex) on the surface of the original CAD model.

FIGS. 2A and 2B illustrate the surface recovery technique implemented by code executing in the processor, as applied to a 2D mesh. The original CAD model is a regular shape, comprising an outer square and an inner regular octagon. The slave boundary representation is an irregular 2D mesh. By virtue of the process of generating the slave boundary representation, it is spatially co-registered with the master boundary representation, i.e., they have the same frame of reference. This enables direct comparison of corresponding surfaces and other features (e.g., edges and corners). As shown in FIG. 2A, the vertices on the 2D mesh are moved to the closest point on the CAD model edge (in a direction normal to that edge). FIG. 2B shows the result of this process.

FIG. 3 illustrates the same surface recovery technique implemented by code executing in the processor, as applied to a 3D mesh. It can be seen that the surface recovery technique is effective in recovering flat or smooth surfaces (e.g., the outer square of the original CAD model in the FIG. 2 example) However, the algorithm leaves behind bevelled facets in the reconstructed surface in place of sharp features in the CAD model.

The process of digitization/voxelization and isosurfacing means that a priori all feature edges are bevelled. Whilst the process of moving vertices to the closest point on the surface of the original CAD recovers vertex accuracy, edges will remain bevelled as the moved vertices will not necessarily or usually sit along the feature edge. Again by referencing the original CAD, a correction can be applied to the new CAD to recover these feature edges. The technique of modifying the slave boundary representation to recover sharp edges and corners from the original CAD model is discussed now with reference to FIGS. 4, 5 and 6.

The feature edges in the original CAD are identified (they can either be flagged as such by the user or identified in automated fashion using a range of algorithms implemented as code executing in the processor, e.g., based on threshold angle between polygon faces).

Once identified, several approaches are possible for modifying the slave boundary representation to conform to the original CAD model, all of which can be implemented by code executing in the processor. For example, vertices on polygons on either face straddling the feature edge can be moved to the edge thereby recovering the edge. Alternatively polygons straddling the feature edge can be split into several polygons with a new central vertex and this new spawned central vertex can be snapped (e.g., shortest distance) to the feature edge. Similarly, feature corners to be recovered can be identified automatically or flagged by the user. To recover feature corners either a suitable existing vertex or a new vertex created by splitting the closest polygon in the new CAD are moved to the corner vertex position on the surface of the original CAD model.

The procedure for converting smoothed, bevelled or chamfered features edges and corners into sharp ones is complicated because it requires the deduction of the exact location of the sharp feature relative to the existing slave boundary representation and non-trivial modification of mesh topology and/or vertex positions. Previous implementations [1-3] use thresholds on the angle of separation between surface normal for deducing the location where feature edges must be generated. In contrast, the embodiments of the invention make use of information available in the original CAD model as a reference for locating sharp features.

Figure 4A:
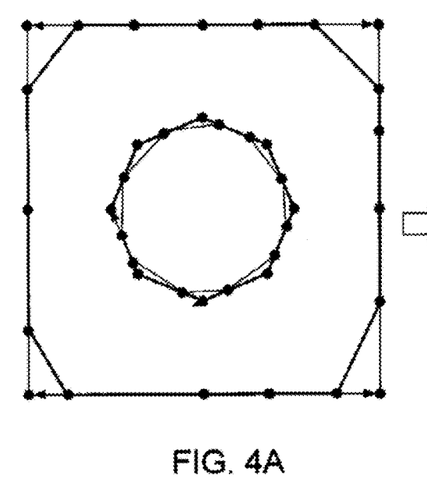
FIGS. 4A and 4B illustrate the steps of recovering corner features on a 2D slave boundary representation by moving existing vertices.
Figure 4B:
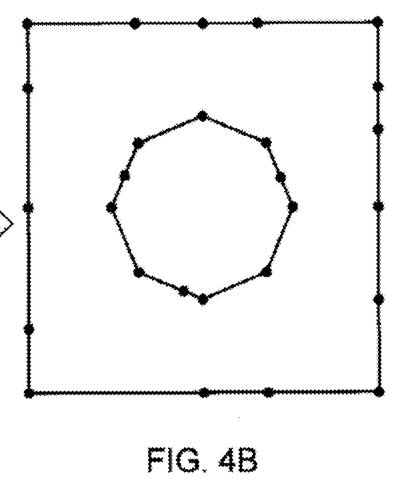

FIGS. 4A and 4B illustrate the feature edge/corner recovery technique applied to the 2D mesh of FIG. 2 utilizing a computer having a processor configured by code to implement the algorithms and techniques discussed next. In FIG. 4A, the vertices closest to the sharp features are identified and moved to match the location of the sharp feature. More specifically, the code operates to change the data in the memory device to move the vertices as described. FIG. 4B shows the result. As in the surface recovery algorithm, the topology of the mesh is preserved in the representation included in the memory device, but some elements of a subsequently generated volume mesh might be highly stretched or skewed.

Figure 5A:
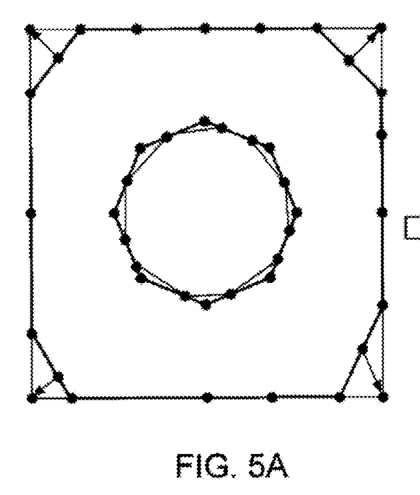
FIGS. 5A and 5B illustrate the steps of recovering corner features on a 2D slave boundary representation by spawning new vertices.
Figure 5B:
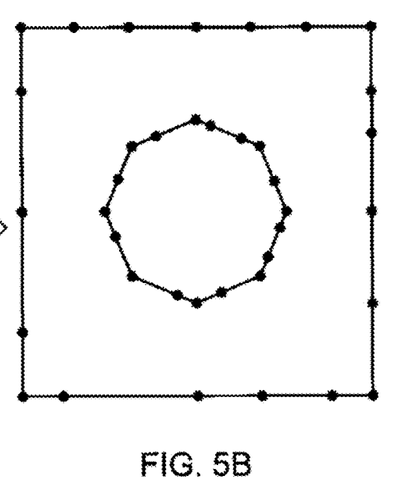

FIGS. 5A and 5B illustrate an alternative feature edge/corner recovery technique applied to the 2D mesh of FIG. 2. In this example, edges in the mesh closest to the sharp feature are identified and split at the midpoint through processing and changes to the data in the memory device similar to as just described. As shown in FIG. 5A, the triangles connected to these edges are bisected in order to avoid hanging vertices. The new vertices are moved to match the location of sharp features, shown in FIG. 5B.

Figure 6:
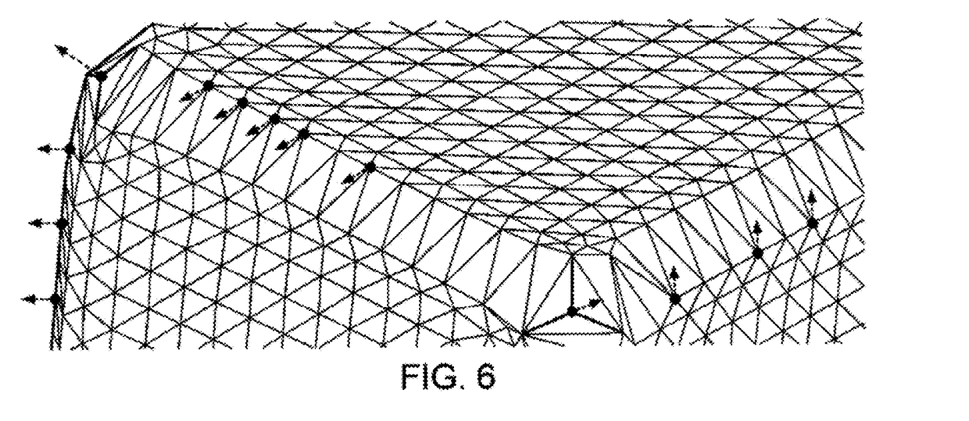
FIG. 6 illustrates the step of recovering edge and corner features on a 3D slave boundary representation by moving existing vertices and spawning new vertices.

FIG. 6 illustrates the same feature edge/corner recovery technique applied to a 3D mesh. It is possible to use a combination of the techniques shown in FIGS. 5A and 5B depending on the local topology of the boundary representation and the distance from the feature edge.

Figure 7:
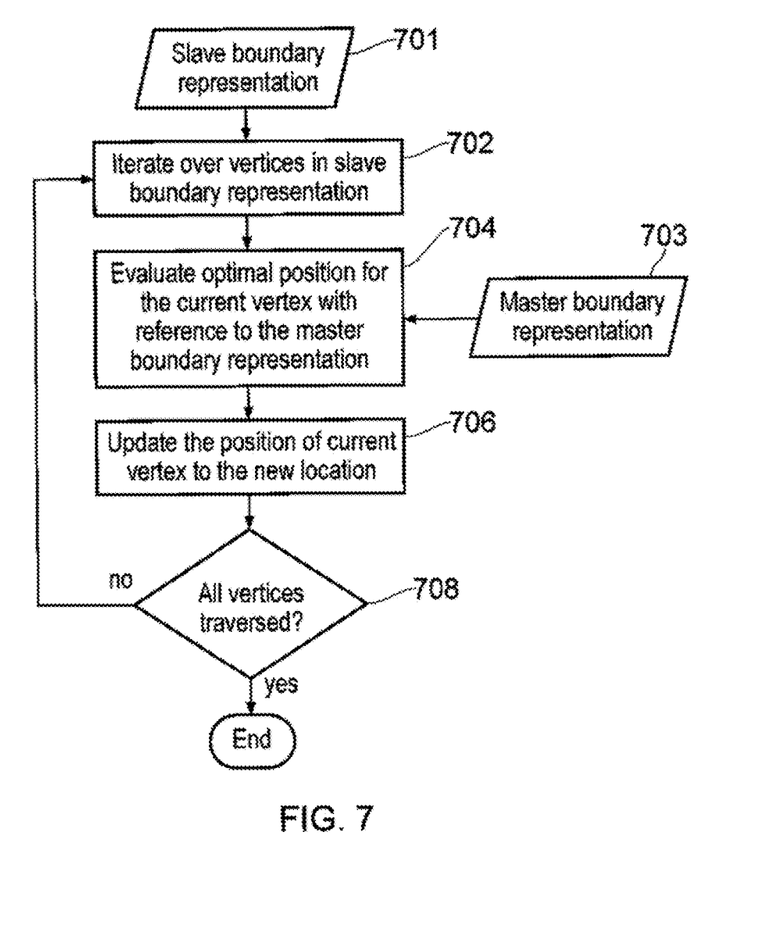
FIG. 7 is a flow chart illustrating a procedure for recovering a surface in a 3D slave boundary representation.

FIG. 7 is a flowchart depicting the steps of the surface recovery technique discussed above with reference to FIGS. 2 and 3. The inputs to the method are the slave boundary representation 701 and original CAD model (master boundary representation) 703, both of which are stored in memory (e.g., a non-transitory, computer readable memory device) which is accessible to the processor implementing portions of the embodiment illustrated in FIG. 7. The method includes a loop which repeats the position updating step for each vertex in the slave boundary representation. At a first step 702, a processor configured by code executing therein selects a vertex to be updated. The code can further cause the processor to set a flag for each vertex at this stage so the fact that its position has been updated is recorded. In a second step 704, the processor is configured by code to compare the selected vertex in the slave boundary representation with the original CAD model to identify an optimal position with reference to the original boundary representation. For example, the optimal position can be the closest point to the vertex on the CAD model surface (e.g., along a normal to the original CAD surface). In a third step 706, the processor is configured to cause the selected vertex to move to the optimal position. In a fourth step 708, the processor is configured to assess whether all of the vertices have been updated (e.g., by referring to the state of the flags stored for each vertex). If all the vertices have been updated, the process ends. If not, the method loops back to the first step 702 to select the next vertex.

Figure 8:
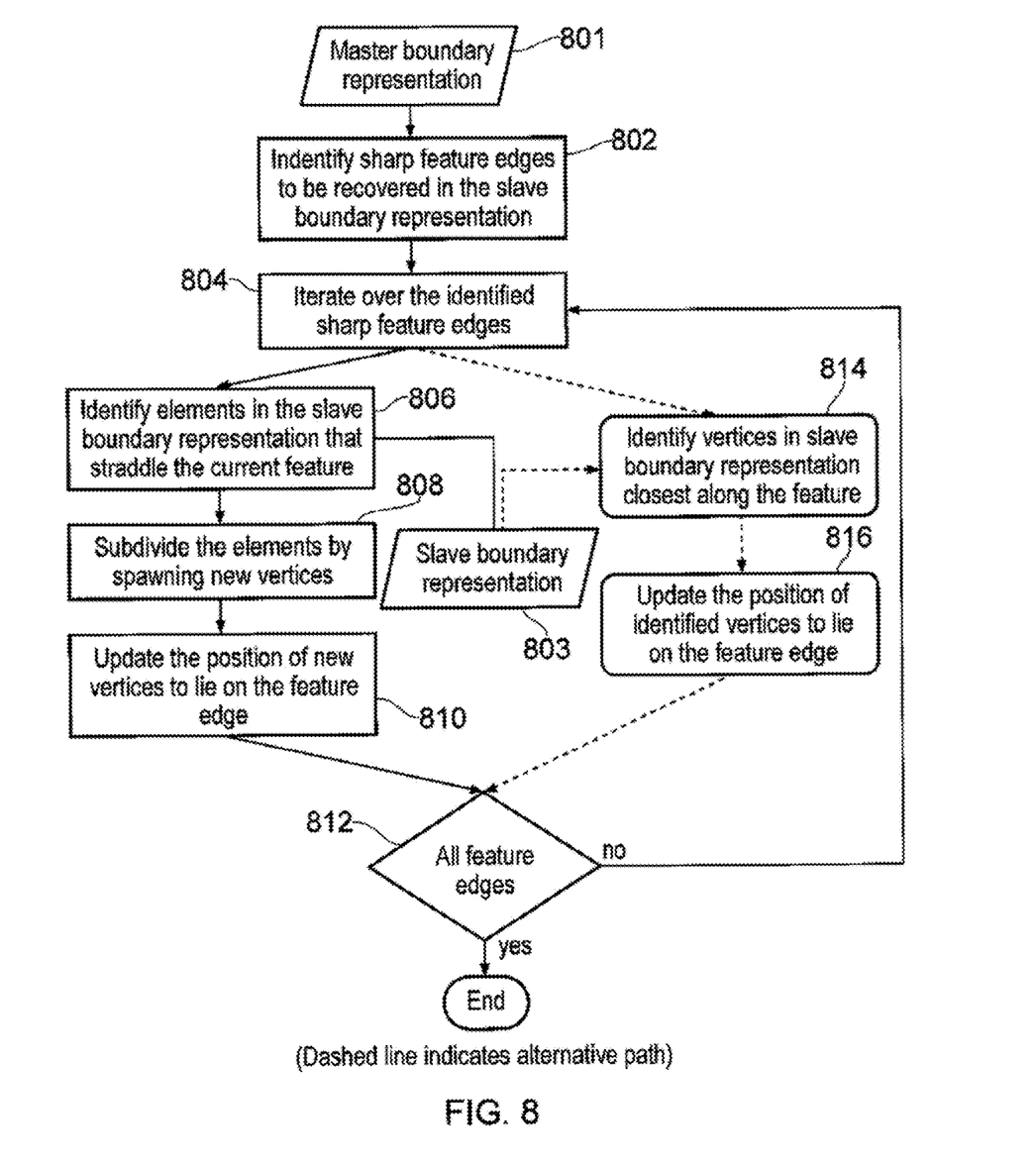
FIG. 8 is a flow chart illustrating a procedure for recovering edges in a 3D slave boundary representation.

FIG. 8 is a flowchart depicting the steps of the feature edge recovery technique discussed above with reference to FIG. 4 that can be performed by the processor when executing code to provide that functionality. A similar process can be used to recover corner features. Again, the inputs for this technique are the master boundary representation 801 (original CAD model) and the slave boundary representation 803 (which may have been modified by the process discussed above with reference to FIG. 7). In a first step 802, a processor configured by code executing therein identifies the edges (or corners) in the master boundary representation that are to be designated as "sharp features" for recovery. This step can thus generate a list of feature edges (and/or corners) to be recovered, which list can be stored in the memory device and used by the processor for further steps in the process. In a second step 804, the processor is configured by code executing therein to select one of the identified features. The method includes a loop which repeats the recovery steps for each identified feature. For each feature, there are two alternative recovery processes. The particular process used may depend on the nature of the selected feature. Indeed, the processor can be configured by code executing therein to automatically select which process to utilize, e.g., based on parameters of the feature, or manually selected. Each alternative is implemented using code executing in the processor which is configured by such code to make the identifications, divisions of data, updates, queries, and so on until the process terminates.

The first alternative recovery technique begins with a step 806 of identifying elements in the slave boundary representation which straddle the selected feature. Herein elements may refer to the contiguous polygons which define the surface of the slave boundary representation. In step 808, each of the straddling elements is divided to spawn a new vertex. In step 810, the position of the new vertex is updated to lie on the selected feature edge (or at the feature corner). Following step 810, the process proceeds to a step 812 of querying whether or not all of the identified features have been recovered. If the answer is no, the process loops back to the selection step 804. If the answer is yes, the process terminates.

The second alternative recovery technique begins with a step 814 of identifying vertices in the slave boundary representation which are closest to the selected feature edge (or corner). After the closest vertices are identified, the technique moves to a step 816 of updating the position of the closest vertices so that they lie on the selected feature edge (or at the feature corner). Following the updating step 816, the process proceeds to the step 812 of querying whether or not all of the identified features have been recovered.

The healing techniques listed above can be applied in the following example of invalid CAD models:

1. CAD Model with Non-Conforming Patches
    voxelise CAD model using a signed distance function and a sample rate of 1 mm;
    extract isosurface using marching cubes algorithm;
    store isosurface as a triangulated surface in an STL file.
2. CAD Model Composed of Shells:
    voxelise CAD model using an unsigned distance function and a sample rate of 1 mm;
    extract isosurface using marching cubes algorithm;
    store isosurface as a triangulated surface in an STL file.
3. CAD Model with Holes:
    voxelise CAD model using an unsigned distance function and a sample rate of 1 mm;
    paint closed holes in the surface;
    perform inverted floodfill to solidify the model;
    extract isosurface using marching cubes algorithm;
    store isosurface as a triangulated surface in an STL file.
4. CAD Model Composed of Shells and Closed Surfaces
    identify and separate shells and closed surfaces;
    voxelise shells using an unsigned distance function and a sample rate of 1 mm;
    voxelise closed surfaces using a signed distance function and a sample rate of 1 mm; union voxelized shells and closed surfaces to produce final volume;
    extract isosurface using the marching cubes algorithm (isosurface for voxelized shells chosen to achieve a pre-defined thickness);
5. An Assembly of Closed Surface Parts with Poor Conformity (Between Parts):
    merge parts into a single, intersecting, part.
    voxelise single part using a signed distance function;
    perform a morphological close operation to close the cavities between parts;
    extract an isosurface using the marching cubes algorithm;
    store the isosurface is stored as a triangulated surface in an STL file.

Triangulated surfaces, generated from CAD models, are often used to define the input geometry for rapid prototyping. The methods described above can therefore be applied directly to a triangulated surface to produce a valid STL file (i.e., a robust closed surface).

REFERENCES

[1] M. Attene, B. Falcidieno, J. Rossignac and M. Spagnuolo, *Sharpen & Bend: Recovering curved sharp edges in triangle meshes produced by feature-insensitive sampling*. IEEE Transactions on Visualization and Computer Graphics, 2005.
[2] Marco Attene, Bianca Falcidieno, Jarek Rossignac, Michela Spagnuolo, *Edge-sharpener: recovering sharp features in triangulations of non-adaptively re-meshed surfaces*, Proceedings of the 2003 Eurographics/ACM SIGGRAPH symposium on Geometry processing, June 2003.
[3] Charlie C. L. Wang, *Incremental Reconstruction of Sharp Edges on Mesh Surfaces*. Computer-Aided Design, Volume 38, Issue 6, June 2006.

The invention claimed is:

1. A computer-implemented method of improving a 3D mesh model representation of a three-dimensional object in a computer having a processor and a memory device, the 3D mesh model representation comprising a plurality of vertices, the method comprising:
    receiving a master boundary representation of the three-dimensional object;

utilizing the computer to automatically detect one or more regions in the 3D mesh model representation, each of the detected regions having a displacement relative to a corresponding region of the master boundary representation; and modifying by the computer the 3D mesh model representation using code executed by the computer including selecting vertices having positions in a first one of the detected regions of the 3D mesh model representation, and updating the positions of the selected vertices to reduce the displacement of the first detected region relative to the corresponding region of the master boundary representation.

2. The method according to claim 1, wherein the 3D mesh model representation comprises a plurality of contiguous polygons, and wherein each of the plurality of vertices is a point at an intersection between two or more of the plurality of contiguous polygons.

3. The method according to claim 1, wherein the 3D mesh model representation comprises a plurality of contiguous cells, and wherein each of the plurality of points is a vertex at the intersection between two or more of the plurality of contiguous cells at the surface of the object.

4. The method according to claim 1, including generating the 3D mesh model representation by isosurfacing a digitized three-dimensional representation of the object by implementing a marching cubes algorithm.

5. The method according to claim 1, including generating the 3D mesh model representation by generating a volume mesh of a digitized three-dimensional representation of the object.

6. The method according to claim 1, wherein automatically detecting one or more regions in the 3D mesh model representation includes processing a digitized three-dimensional representation of the object.

7. The method according to claim 1, further comprising receiving from a user identification of the first one of the detected regions.

8. The method according to claim 1, further comprising further modifying by the computer the 3D mesh model representation using code executed by the computer including selecting vertices having positions in a second one of the detected regions of the 3D mesh model representation, and updating the positions of the selected vertices in the second detected region to reduce the displacement of the second detected region relative to the corresponding region of the master boundary representation.

9. A computer-implemented method of manufacturing a physical model in a computer having a processor and a memory device, the method comprising:

receiving a master boundary representation of the physical model and a 3D mesh model representation of the physical model in the memory device, the 3D mesh model including a plurality of vertices;

utilizing the computer to automatically detect one or more regions in the 3D mesh model representation, each of the detected regions having a displacement relative to a corresponding region of the master boundary representation;

modifying by the computer the 3D mesh model representation using code executed by the computer including selecting vertices having positions in a first one of the detected regions of the 3D mesh model representation, and updating the positions of the selected vertices to reduce the displacement of the first detected region relative to the corresponding region of the master boundary representation;

outputting the 3D mesh model representation to a manufacturing unit; and operating the manufacturing unit to create a physical model corresponding to the 3D mesh model representation.

10. The method according to claim 9, wherein the 3D mesh model representation comprises a plurality of contiguous polygons, and wherein each of the plurality of vertices is a point at an intersection between two or more of the plurality of contiguous polygons.

11. The method according to claim 9, wherein the 3D mesh model representation comprises a plurality of contiguous cells, and wherein each of the plurality of points is a vertex at the intersection between two or more of the plurality of contiguous cells at the surface of the object.

12. The method according to claim 9, including generating the 3D mesh model representation by isosurfacing a digitized three-dimensional representation of the physical model by implementing a marching cubes algorithm.

13. The method according to claim 9, including generating the 3D mesh model representation by generating a volume mesh of a digitized three-dimensional representation of the physical model.

14. The method according to claim 9, wherein automatically detecting one or more regions in the 3D mesh model representation includes processing a digitized three-dimensional representation of the object.

15. The method according to claim 9, wherein the manufacturing unit is a three-dimensional printer or a CNC machine.

16. The method according to claim 9, further comprising receiving from a user identification of the first one of the detected regions.

17. The method according to claim 9, further comprising further modifying by the computer the 3D mesh model representation using code executed by the computer including selecting vertices having positions in a second one of the detected regions of the 3D mesh model representation, and updating the positions of the selected vertices in the second detected region to reduce the displacement of the second detected region relative to the corresponding region of the master boundary representation.

18. A non-transitory computer readable medium having stored thereon a plurality of instructions which when executed by a processor implements a method of improving conformance of a 3D mesh model representation of a three-dimensional object to a master boundary representation of the three-dimensional object, the plurality of instructions comprising instructions that cause the processor to:

detect one or more regions in the 3D mesh model representation, each of the detected regions having a displacement relative to a corresponding region of the master boundary representation; and modify the 3D mesh model representation by selecting vertices having positions in a first one of the detected regions of the 3D mesh model representation, and updating the positions of the selected vertices to reduce the displacement of the first detected region relative to the corresponding region of the master boundary representation.

19. The non-transitory computer readable medium of claim 18, wherein the 3D mesh model representation comprises a plurality of contiguous polygons, and wherein each of the plurality of vertices is a point at an intersection between two or more of the plurality of contiguous polygons.

20. The non-transitory computer readable medium of claim 18, wherein the 3D mesh model representation comprises a plurality of contiguous cells, and wherein each of the plurality of points is a vertex at the intersection between two or more of the plurality of contiguous cells at the surface of the object.

21. The non-transitory computer readable medium of claim 18, further including generating the 3D mesh model representation by isosurfacing a digitized three-dimensional representation of the object by implementing a marching cubes algorithm.

22. The non-transitory computer readable medium of claim 18, including generating the 3D mesh model representation by generating a volume mesh of a digitized three-dimensional representation of the object.

23. The non-transitory computer readable medium of claim 18, wherein detecting one or more regions in the 3D mesh model representation comprises processing a digitized three-dimensional representation of the object.

* * * * *